United States Patent
Yamaji

(10) Patent No.: US 11,146,268 B2
(45) Date of Patent: Oct. 12, 2021

(54) HIGH VOLTAGE INTEGRATED CIRCUIT

(71) Applicant: Fuji Electric Co., Ltd., Kanagawa (JP)

(72) Inventor: Masaharu Yamaji, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 257 days.

(21) Appl. No.: 16/528,921

(22) Filed: Aug. 1, 2019

(65) Prior Publication Data

US 2020/0044652 A1 Feb. 6, 2020

(30) Foreign Application Priority Data

Aug. 6, 2018 (JP) .............................. JP2018-147535

(51) Int. Cl.
*H03K 17/693* (2006.01)

(52) U.S. Cl.
CPC .................................. *H03K 17/693* (2013.01)

(58) Field of Classification Search
CPC .............. H03K 17/687; H03K 17/693; H03K 17/08128
See application file for complete search history.

(56) References Cited

U.S. PATENT DOCUMENTS

2012/0081149 A1\* 4/2012 Akahane ........ H03K 19/018521
326/81

FOREIGN PATENT DOCUMENTS

| JP | 2005-051821 A | 2/2005 |
| JP | 2011-015136 A | 1/2011 |

\* cited by examiner

*Primary Examiner* — Sibin Chen
(74) *Attorney, Agent, or Firm* — Chen Yoshimura LLP

(57) ABSTRACT

In a level shifter circuit that transmits a set signal and a reset signal input to input terminals of a high-side latch circuit, the source sides of high voltage transistors are connected to current negative feedback resistors, and transistors are connected in parallel to the current negative feedback resistors. Further included is a high-side voltage detection circuit that detects whether the voltage of a high-side power supply terminal is a high voltage. When a high voltage is detected, the transistors are turned OFF to make the drain currents that flow smaller, thereby making it possible to improve the trade-off between heat generation and propagation delay characteristics in the high voltage transistors.

6 Claims, 4 Drawing Sheets

HIGH VOLTAGE INTEGRATED CIRCUIT

BACKGROUND OF THE INVENTION

Technical Field

The present invention relates to a high voltage integrated circuit, and more particularly to a high voltage integrated circuit for use in a gate driver which drives a power device in a power converter such as a switching power supply.

Background Art

Power converters sometimes utilize half-bridge circuits in which power devices on an upper arm side and a lower arm side are connected in series, for example. Here, the power device on the upper arm side and the power device on the lower arm side are driven by gate drivers with different respective reference voltages. More specifically, a high voltage integrated circuit is used in the gate driver on the upper arm side. In this high voltage integrated circuit, a signal that switches the power device on the upper arm side ON and OFF is generated and input on the basis of a common voltage that serves as the ground voltage for a signal that switches the power device on the lower arm side ON and OFF. Therefore, the high voltage integrated circuit includes a level shifter circuit which level-shifts and uses the signal that is referenced to the common voltage and that switches the power device on the upper arm side ON and OFF (see Patent Document 1, for example). Here, the high voltage integrated circuit disclosed in Patent Document 1 will be described.

FIG. 4 is a circuit diagram illustrating an example configuration of a conventional high voltage integrated circuit. Note that in the following description, the same reference characters are sometimes used both to label terminals in the circuit diagrams as well as to indicate voltages, signals, or the like present at those terminals.

In FIG. 4, power devices QH and QL form a half-bridge circuit for converting power in a switching power supply, for example. Insulated-gate bipolar transistors (IGBTs) are used for the power devices QH and QL in the illustrated example. The collector terminal of the power device QH is connected to a positive terminal Vdc of a high-voltage power supply, and the emitter terminal of the power device QH is connected to an output terminal OUT of the half-bridge circuit and to the collector terminal of the power device QL. The emitter terminal of the power device QL is connected to a ground-voltage common voltage terminal COM, which is the negative terminal of the high-voltage power supply.

This high voltage integrated circuit 100 includes an input terminal IN1 to which a signal that switches ON the power device QH is input, an input terminal IN2 to which a signal that switches OFF the power device QH is input, a high-side power supply terminal VCC1, and a high-side reference voltage terminal VS.

The high voltage integrated circuit 100 further includes a level shifter circuit including N-channel high voltage transistors HVN1 and HVN2, current negative feedback resistors Rsf1 and Rsf2, level shift resistors Rls1 and Rls2, and inverter circuits INV1 and INV2.

In this level shifter circuit, the input terminal IN1 is connected to the gate terminal of the high voltage transistor HVN1, and the input terminal IN2 is connected to the gate terminal of the high voltage transistor HVN2. The source terminal of the high voltage transistor HVN1 is connected to one terminal of the current negative feedback resistor Rsf1, and the other terminal of the current negative feedback resistor Rsf1 is connected to the common voltage terminal COM. The source terminal of the high voltage transistor HVN2 is connected to one terminal of the current negative feedback resistor Rsf2, and the other terminal of the current negative feedback resistor Rsf2 is connected to the common voltage terminal COM. The drain terminal of the high voltage transistor HVN1 is connected to one terminal of the level shift resistor Rls1 and to an input terminal of the inverter circuit INV1, and the other terminal of the level shift resistor Rls1 is connected to the high-side power supply terminal VCC1. The drain terminal of the high voltage transistor HVN2 is connected to one terminal of the level shift resistor Rls2 and to an input terminal of the inverter circuit INV2, and the other terminal of the level shift resistor Rls2 is connected to the high-side power supply terminal VCC1.

The output terminals of the inverter circuits INV1 and INV2 in the level shifter circuit are respectively connected to the set input terminal S and reset input terminal R of a latch circuit LAT constituted by an RS flip-flop. The output terminal Q of the latch circuit LAT is connected to an input terminal of a driver circuit DRV, and an output terminal of the driver circuit DRV is connected to the gate terminal of the power device QH. The driver circuit DRV is connected to the high-side power supply terminal VCC1 and to the high-side reference voltage terminal VS. The high-side power supply terminal VCC1 is connected to the positive terminal of a high-side floating power supply E1, and the negative terminal of this floating power supply E1 is connected to the high-side reference voltage terminal VS and to the output terminal OUT of the half-bridge circuit.

In this high voltage integrated circuit 100, when a signal that switches ON the power device QH is input to the input terminal IN1, the high voltage transistor HVN1 turns ON, causing drain current to flow and a voltage drop to develop across the level shift resistor Rls1. As a result, the voltage of the input terminal of the inverter circuit INV1 decreases and the inverter circuit INV1 inputs a set signal to the set input terminal S of the latch circuit LAT, thereby setting the latch circuit LAT to a set state. At this time, the latch circuit LAT outputs a signal which is at a high level relative to a high-side reference voltage of the output terminal OUT to the output terminal Q, and the driver circuit DRV outputs a gate signal which is at a high level relative to the high-side reference voltage to the gate terminal of the power device QH. As a result, the power device QH is turned ON.

Meanwhile, when a signal that switches OFF the power device QH is input to the input terminal IN2, the high voltage transistor HVN2 turns ON, causing drain current to flow and a voltage drop to develop across the level shift resistor Rls2. As a result, the voltage of the input terminal of the inverter circuit INV2 decreases and the inverter circuit INV2 inputs a reset signal to the reset input terminal R of the latch circuit LAT, thereby setting the latch circuit LAT to a reset state. At this time, the latch circuit LAT outputs a signal which is at a low level relative to the high-side reference voltage to the output terminal Q, and the driver circuit DRV outputs a gate signal which is at a low level relative to the high-side reference voltage to the gate terminal of the power device QH. As a result, the power device QH is turned OFF.

Here, in the level shifter circuit, the current negative feedback resistors Rsf1 and Rsf2 are respectively inserted between the source terminals of the high voltage transistors HVN1 and HVN2 and the common voltage terminal COM. These current negative feedback resistors Rsf1 and Rsf2 serve to make currents flowing through the high voltage transistors HVN1 and HVN2 constant, as well as to prevent heat generation (mitigate loss) and stabilize the level-shifted signals, for example. In other words, when the high voltage transistors HVN1 and HVN2 switch ON and current flows through the current negative feedback resistors Rsf1 and Rsf2, voltage drops develop across the current negative feedback resistors Rsf1 and Rsf2, and these voltage drops are negatively fed back to the gate terminals of the high voltage transistors HVN1 and HVN2. As a result, with respect to the currents flowing through the high voltage transistors HVN1 and HVN2, constant drain currents flow even if the drain voltages are increased. Moreover, these constant-current drain currents are significantly reduced in comparison to when the current negative feedback resistors Rsf1 and Rsf2 are not present, thereby resulting in smaller losses and reduced heat generation. In addition, because the drain currents have been made constant currents, the voltage drops that develop across the level shift resistors Rls1 and Rls2 stabilize, thereby making it possible to stabilize the signals input to the input terminals IN1 and IN2 prior to propagation to the latch circuit LAT.

Furthermore, level shifter circuits in which a constant current circuit is inserted between a common voltage terminal and the source terminals of high voltage transistors are also known (see Patent Document 2, for example). In Patent Document 2, a current mirror circuit is connected to the source terminal of a high voltage transistor, and the gate terminal of the high voltage transistor and the current input terminal of the current mirror circuit are connected to create a Wilson current mirror circuit. As a result, the drain current of the high voltage transistor is determined by the current injected into the current mirror circuit, thereby making it possible to appropriately maintain the voltage drop across a level shift resistor and to in turn transmit a stabilized signal. Moreover, the drain current of the high voltage transistor can be set to a small value by adjusting the current injected into the current mirror circuit, thereby reducing the power consumption of and reducing the amount of heat generated by the high voltage transistor.

RELATED ART DOCUMENTS

Patent Documents

Patent Document 1: Japanese Patent Application Laid-Open Publication No. 2005-051821 (FIG. 5)
Patent Document 2: Japanese Patent Application Laid-Open Publication No. 2011-015136 (FIG. 1)

SUMMARY OF THE INVENTION

In high voltage integrated circuits of the type described above, demand for miniaturization of power supply boards (printed circuit boards) has resulted in strong demand for increasingly high-frequency switching frequencies. More specifically, there is demand for increasingly high frequencies of anywhere from several dozen kHz to 100 kHz all the way up to several hundred kHz to 1 GHz, approximately. In a high voltage transistor in a level shifter circuit included in a high voltage integrated circuit, when a reset signal is input while the power device on the upper arm side is in the ON state in particular, the level shift conversion is performed in a state in which the drain voltage has increased to several hundred volts. At this time, the high voltage transistor exhibits self-heat generation that is proportional to the quantity (drain current×drain voltage×gate-ON time× switching frequency), which is accompanied by significant heat loss. With the technologies disclosed in Patent Documents 1 and 2, although resistors or a current mirror circuit are inserted between the common voltage terminal and the source terminals of the high voltage transistors, this serves only to stabilize the drain currents of the high voltage transistors. The only ways to attempt to reduce heat loss when operating the high voltage transistors at high frequencies would be to further limit the drain currents themselves or to reduce the gate-ON times. Furthermore, limiting the drain currents results in a decreased ability to discharge the output capacitance of the high voltage transistors (Coss=drain-source capacitance+gate-drain capacitance), which in turn increases the input/output propagation delay times when the high voltage transistors turn ON and OFF. Moreover, reducing the gate-ON times decreases propagation margins as a result of incorrect signal propagation or the like due to introduction of noise into the level-shifted signals, for example. Therefore, when designing for increasingly higher frequencies in high voltage integrated circuits, there is a trade-off between heat generation and propagation delay characteristics, and improving this trade-off requires making device improvements such as reducing the output capacitance (Coss) of the high voltage transistors or reducing losses, for example.

The present invention was made in view of the points described above and aims to provide a high voltage integrated circuit that improves the trade-off between heat generation and propagation delay characteristics in high voltage transistors included in the high voltage integrated circuit.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a high voltage integrated circuit for controlling a high-side power transistor of a half-bridge circuit connected between a positive terminal and a grounded common terminal of a high voltage power supply, the half-bridge circuit being formed of said high-side power transistor and a lower-side power transistor connected in series with a node therebetween being an output terminal, a voltage at the output terminal being a high-side reference voltage, the high voltage integrated circuit including: a high-side driver circuit configured to be connected to the high-side power transistor to drive the high-side power transistor, the high-side driver circuit being powered by a high-side power supply voltage generated relative to the high-side reference voltage by a floating power supply; a level shifter circuit that converts an ON signal and an OFF signal that are input to the high voltage integrated circuit and that are set with reference to a common voltage of the common terminal to a level-shifted set signal and a level-shifted reset signal, respectively, that are set with reference to the high-side reference voltage; a high-side latch circuit that receives the level-shifted set signal and supplies a signal to the high-side driver circuit that causes the high-side driver circuit to turn on the high-side power transistor in response thereto and that receives the level-shifted reset signal and supplies a signal to the high-side driver circuit that causes the high-side driver circuit to turn off the high-side power transistor in response thereto; and a high-side voltage detection circuit that detects a voltage level of the high-side reference voltage or a voltage level of the high-side power supply voltage, wherein the level shifter circuit includes: a first high voltage transistor that causes the level-shifted set signal to output to the high-side latch circuit; a first resistor arranged between the first high voltage transistor and the common voltage; a second high voltage transistor that causes the level-shifted reset signal to output to the high-side latch circuit; a second resistor arranged between the second high voltage transistor and the common voltage; and a switching device that is connected in parallel to the second resistor and that is configured to be turned ON when the voltage level detected by the high-side voltage detection circuit is a low level and be turned OFF when the voltage level detected by the high-side voltage detection circuit is a high level.

In the high voltage integrated circuit configured as described above, when the detected voltage level is high, the switching device is turned OFF. This causes the resistance of the second resistor to be applied, and thus decreases the drain current, thereby making it possible to improve the trade-off between heat generation and propagation delay characteristics.

It is to be understood that both the foregoing general description and the following detailed description are exemplary and explanatory, and are intended to provide further explanation of the invention as claimed.

DETAILED DESCRIPTION OF EMBODIMENTS

Figure 1:
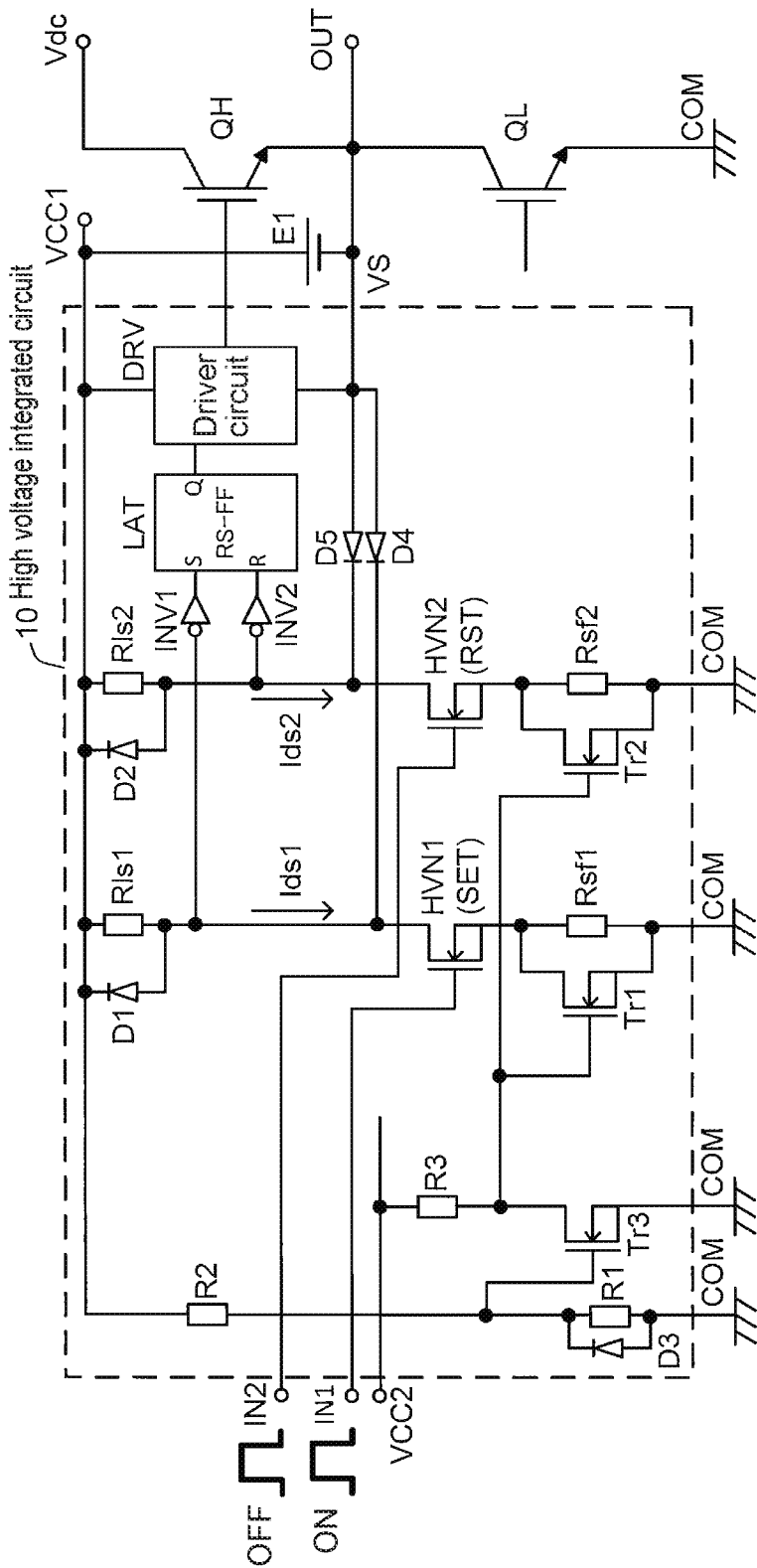
FIG. 1 is a circuit diagram illustrating an example configuration of a high voltage integrated circuit according to Embodiment 1 of the present invention.

Next, embodiments of the present invention will be described in detail with reference to the attached figures. Note that in the following description, the same reference characters are sometimes used both to label terminals in the circuit diagrams as well as to indicate voltages, signals, or the like present at those terminals. Moreover, each of the embodiments can be implemented by partially combining one or more other embodiments as long as doing so does not represent a technical impossibility.

Figure 2:
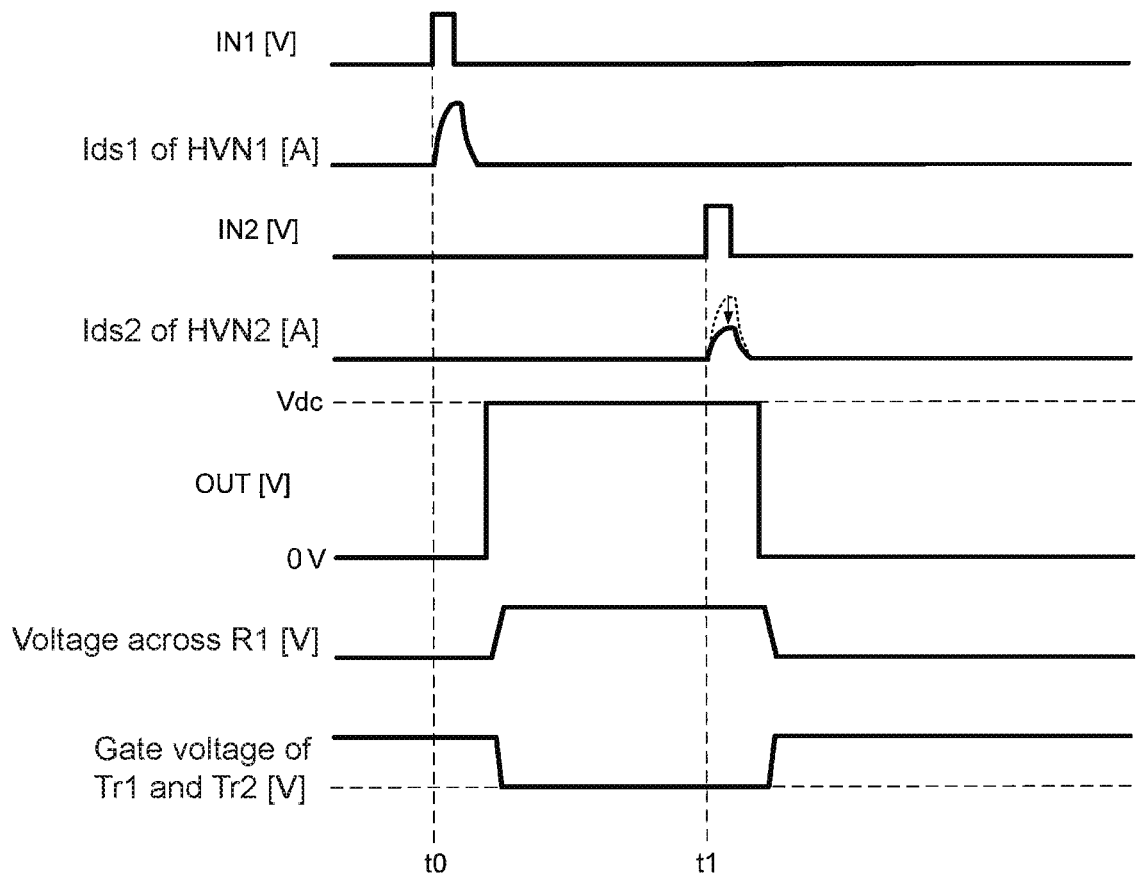
FIG. 2 illustrates the primary waveforms in the high voltage integrated circuit.
Figure 4:
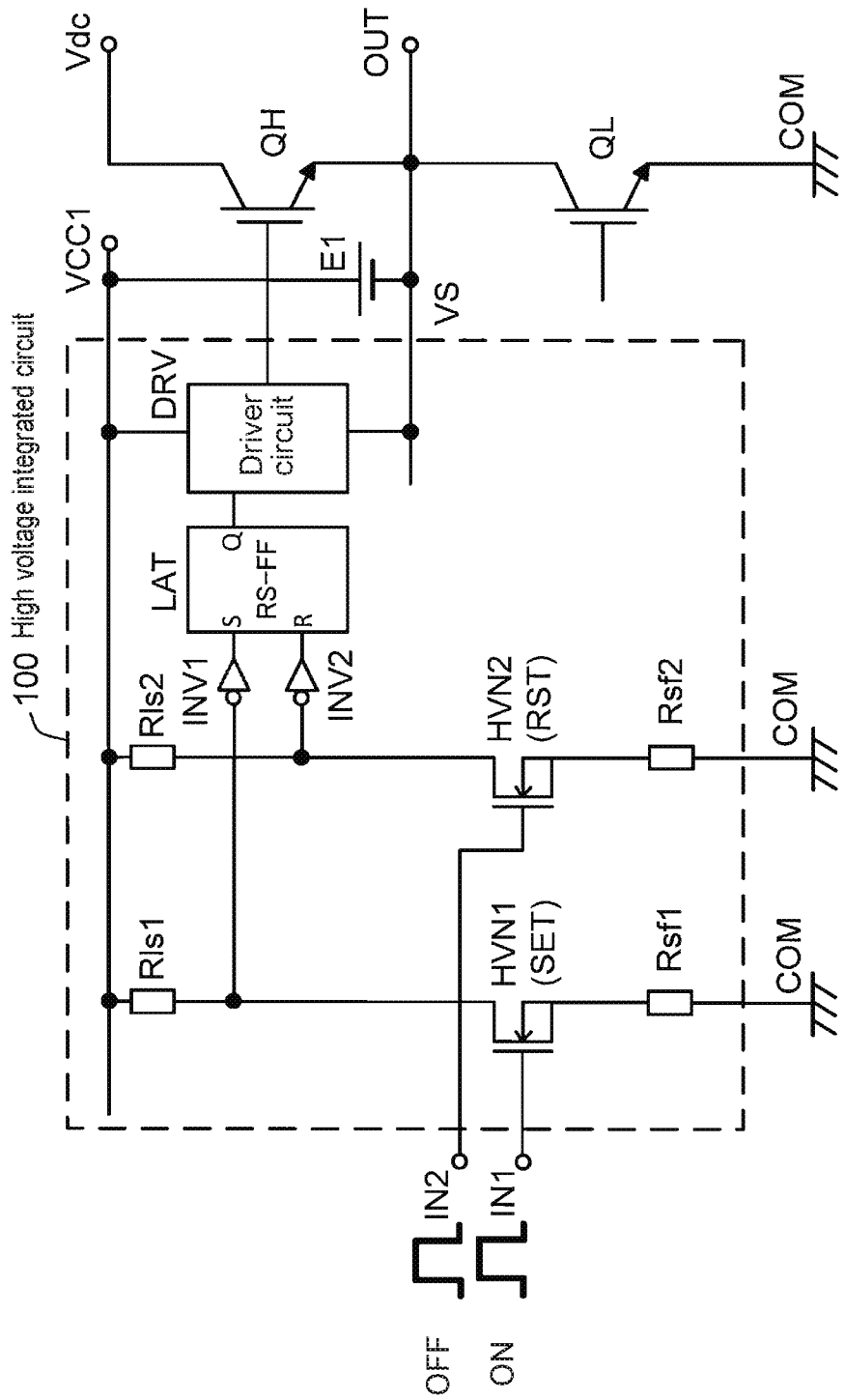
FIG. 4 is a circuit diagram illustrating an example configuration of a conventional high voltage integrated circuit.

FIG. 1 is a circuit diagram illustrating an example configuration of a high voltage integrated circuit according to Embodiment 1 of the present invention. FIG. 2 illustrates the primary waveforms in this high voltage integrated circuit. Note that in FIG. 1, components that are the same as components illustrated in FIG. 4 are given the same reference characters.

In FIG. 1, a high voltage integrated circuit 10 is a circuit for controlling, among power devices (transistors) QH and QL which form a half-bridge circuit for converting power in a switching power supply, the ON/OFF switching of the power device QH, which is arranged on an upper arm side. Here, although IGBTs are used for the power devices QH and QL in the illustrated example, N-channel power metal-oxide-semiconductor field-effect transistors (MOSFETs) may be used instead.

In the half-bridge circuit, the collector terminal of the power device QH is connected to a positive terminal Vdc of a high-voltage power supply, and the emitter terminal of the power device QH is connected to an output terminal OUT of the half-bridge circuit and to the collector terminal of the power device QL. The emitter terminal of the power device QL is connected to a ground-voltage common voltage terminal COM, which is the negative terminal of the high-voltage power supply.

The high voltage integrated circuit 10 includes an input terminal IN1 to which a signal that switches ON the power device QH is input, an input terminal IN2 to which a signal that switches OFF the power device QH is input, a high-side power supply terminal VCC1, a high-side reference voltage terminal VS, and the common voltage terminal COM. The high voltage integrated circuit 10 further includes a power supply terminal VCC2, although the voltage VCC2 that is applied to this power supply terminal VCC2 can be a voltage generated inside or outside of the high voltage integrated circuit 10.

The high voltage integrated circuit 10 further includes a level shifter circuit which converts the signals that are referenced to ground voltage and input to the input terminals IN1 and IN2 to signals that are referenced to a high-side reference voltage, a latch circuit LAT that stores these level-shifted signals, and a driver circuit DRV.

The level shifter circuit includes a high voltage transistor HVN1 (SET; here, an N-channel MOSFET) for transmitting a set signal and a high voltage transistor HVN2 (RST; here, an N-channel MOSFET) for transmitting a reset signal. The gate terminal of the high voltage transistor HVN1 is connected to the input terminal IN1, and the gate terminal of the high voltage transistor HVN2 is connected to the input terminal IN2.

The drain terminal of the high voltage transistor HVN1 is connected to one terminal of a level shift resistor Rls1 and to an input terminal of an inverter circuit INV1, and the other terminal of the level shift resistor Rls1 is connected to the high-side power supply terminal VCC1. The one terminal of the level shift resistor Rls1 is also connected to the anode terminal of a diode D1, and the other terminal of the level shift resistor Rls1 is connected to the cathode terminal of the diode D1. The drain terminal of the high voltage transistor HVN2 is connected to one terminal of a level shift resistor Rls2 and to an input terminal of an inverter circuit INV2, and the other terminal of the level shift resistor Rls2 is connected to the high-side power supply terminal VCC1. The one terminal of the level shift resistor Rls2 is also connected to the anode terminal of a diode D2, and the other terminal of the level shift resistor Rls2 is connected to the cathode terminal of the diode D2.

The source terminal of the high voltage transistor HVN1 is connected to one terminal of a current negative feedback resistor Rsf1, and the other terminal of the current negative feedback resistor Rsf1 is connected to the common voltage terminal COM. The one terminal of the current negative feedback resistor Rsf1 is also connected to the drain terminal of a transistor Tr1 (here, an N-channel MOSFET switching device), and the other terminal of the current negative feedback resistor Rsf1 is connected to the source terminal of the transistor Tr1. The source terminal of the high voltage transistor HVN2 is connected to one terminal of a current negative feedback resistor Rsf2, and the other terminal of the current negative feedback resistor Rsf2 is connected to the common voltage terminal COM. The one terminal of the current negative feedback resistor Rsf2 is also connected to the drain terminal of a transistor Tr2 (here, an N-channel MOSFET switching device), and the other terminal of the current negative feedback resistor Rsf2 is connected to the source terminal of the transistor Tr2.

The level shifter circuit further includes a high-side voltage detection circuit which is arranged between the high-side power supply terminal VCC1 and the common voltage terminal COM and detects the voltage of the high-side power supply terminal VCC1. This high-side voltage detection circuit includes voltage-dividing resistors R1 and R2 which are connected in series, a diode D3 connected in parallel to the voltage-dividing resistor R1, a transistor Tr3 (here, an N-channel MOSFET switching device), and a resistor R3. In other words, one terminal of the voltage-dividing resistor R1 and the anode terminal of the diode D3 are connected to the common voltage terminal COM, and the other terminal of the voltage-dividing resistor R1 and the cathode terminal of the diode D3 are connected to one terminal of the voltage-dividing resistor R2 and to the gate terminal of the transistor Tr3. The other terminal of the voltage-dividing resistor R2 is connected to the high-side power supply terminal VCC1. The source terminal of the transistor Tr3 is connected to the common voltage terminal COM, while the drain terminal of the transistor Tr3 is connected to one terminal of the resistor R3, and the other terminal of the resistor R3 is connected to the power supply terminal VCC2. The node between the drain terminal of the transistor Tr3 and the one terminal of the resistor R3 forms an output terminal of the high-side voltage detection circuit and is connected to the gate terminals of the transistors Tr1 and Tr2.

Here, a resistive field plate (RFP) formed surrounding the level shifter circuit, latch circuit LAT, and driver circuit DRV region within the high voltage integrated circuit 10 is used for the voltage-dividing resistors R1 and R2. This resistive field plate serves to reduce electric field strength at high-voltage junction termination (HVJT) regions in high breakdown voltage devices in high-side circuits (see WO 2013/069408, for example).

The output terminals of the inverter circuits INV1 and INV2 in the level shifter circuit are respectively connected to the set input terminal S and reset input terminal R of the latch circuit LAT, which is constituted by an RS flip-flop. The output terminal Q of the latch circuit LAT is connected to an input terminal of a driver circuit DRV, and an output terminal of the driver circuit DRV is connected to the gate terminal of the power device QH.

The driver circuit DRV is connected to the high-side power supply terminal VCC1 and to the high-side reference voltage terminal VS. The high-side power supply terminal VCC1 is connected to the positive terminal of a high-side floating power supply E1, and the negative terminal of this floating power supply E1 is connected to the high-side reference voltage terminal VS and to the output terminal OUT of the half-bridge circuit.

The high-side reference voltage terminal VS is also connected to the anode terminals of clamp diodes D4 and D5. The cathode terminal of the clamp diode D4 is connected to the collector terminal of the high voltage transistor HVN1, and the cathode terminal of the clamp diode D5 is connected to the collector terminal of the high voltage transistor HVN2.

As illustrated in FIG. 2, in the configuration described above, first, when the power devices QH and QL are in the OFF state, the output terminal OUT which is connected to the high-side reference voltage terminal VS is at the 0 volt (V) voltage of the common voltage terminal COM. Thus, in the high-side voltage detection circuit, the voltage of the node between the voltage-dividing resistors R1 and R2 (the voltage across R1) is 0 V and the transistor Tr3 is in the OFF state, and therefore a voltage equal to the voltage of the power supply terminal VCC2 is applied to the gate terminals of the transistors Tr1 and Tr2. As a result, the transistors Tr1 and Tr2 are both in the ON state, and the current negative feedback resistors Rsf1 and Rsf2 connected to the source terminals of the high voltage transistors HVN1 and HVN2 are respectively in a substantially short-circuited state. In particular, the combined resistance of the on-resistance of the transistors Tr1 and Tr2 connected in parallel to the current negative feedback resistors Rsf1 and Rsf2 becomes the source resistance of the high voltage transistors HVN1 and HVN2.

Here, when a signal that switches ON the power device QH is input to the input terminal IN1 at time t0, the high voltage transistor HVN1 turns ON, and a drain current Ids1 flows through the high voltage transistor HVN1. At this time, although a large drain current Ids1 flows because the source terminal of the high voltage transistor HVN1 is substantially connected to the common voltage terminal COM, the voltage of the drain terminal is low, and therefore the heat loss expended by the high voltage transistor HVN1 is small. Due to the flow of the drain current Ids1, a voltage drop develops across the level shift resistor Rls1, and the voltage of the input terminal of the inverter circuit INV1 decreases. The inverter circuit INV1 inputs a high-level set signal to the set input terminal S of the latch circuit LAT, thereby setting the latch circuit LAT to a set state. Upon taking this set state, the latch circuit LAT outputs a signal which is at a high level relative to the high-side reference voltage to the output terminal Q, and the driver circuit DRV outputs a gate signal which is at a high level relative to the high-side reference voltage to the gate terminal of the power device QH. As a result, the power device QH is turned ON, and the output terminal OUT and the high-side reference voltage terminal VS take the voltage Vdc of the positive terminal Vdc of the high-voltage power supply. At this time, letting the voltage Vdc be 600 V and the voltage E1 of the floating power supply E1 be 15 V, for example, the voltage of the output terminal OUT and the high-side reference voltage terminal VS is 600 V and the voltage VCC1 of the high-side power supply terminal VCC1 is 615 V (relative to the common voltage terminal COM).

In the high-side voltage detection circuit, when the voltage VCC1 of the high-side power supply terminal VCC1 takes a high voltage, the voltage of the node between the voltage-dividing resistors R1 and R2 (the voltage across R1) increases, and a high-level gate voltage is applied to the gate terminal of the transistor Tr3. As a result, the transistor Tr3 takes the ON state, the transistors Tr1 and Tr2 take the OFF state, and the source terminals of the high voltage transistors HVN1 and HVN2 become connected to the current negative feedback resistors Rsf1 and Rsf2.

Next, when a signal that switches OFF the power device QH is input to the input terminal IN2 at time t1, the high voltage transistor HVN2 turns ON, and a drain current Ids2 flows through the high voltage transistor HVN2. As a result, a voltage drop develops across the level shift resistor Rls2, and the voltage of the input terminal of the inverter circuit INV2 decreases. The inverter circuit INV2 inputs a high-level reset signal to the reset input terminal R of the latch circuit LAT, thereby setting the latch circuit LAT to a reset state. Upon taking this reset state, the latch circuit LAT outputs a signal which is at a low level relative to the high-side reference voltage to the output terminal Q, and the driver circuit DRV outputs a gate signal which is at a low level relative to the high-side reference voltage to the gate terminal of the power device QH. As a result, the power device QH is turned OFF, and the output terminal OUT and the high-side reference voltage terminal VS decrease to the voltage of the common voltage terminal COM.

When the high voltage transistor HVN2 turns ON, the current negative feedback resistor Rsf2 is connected to the source terminal of the high voltage transistor HVN2, thereby reducing the drain current Ids2. As a result, the amount of heat generated by the high voltage transistor HVN2 (and in particular the amount of heat generated by the high voltage transistor HVN2 when switching at a high frequency) is small, thereby making it possible to achieve higher switching frequencies.

Here, limiting the drain current Ids2 increases the time required to discharge the electric charge stored by the output capacitance Coss of the high voltage transistor HVN2, which can potentially cause a delay to occur in propagation of the reset signal to the latch circuit LAT. However, at this time, the junction capacitance of the parasitic diode that constitutes the output capacitance Coss of the high voltage transistor HVN2 is significantly reduced. This is because a high voltage is applied to the drain terminal of the high voltage transistor HVN2, which causes depletion of the p-n junction of the parasitic diode of the high voltage transistor HVN2 to proceed to a corresponding degree (the depletion layer width is sufficiently large). This significant reduction in the output capacitance Coss makes it possible to reduce the time required to discharge the output capacitance Coss. In other words, even if the resistance value connected to the source terminal of the high voltage transistor HVN2 is increased to decrease the drain current Ids2, this does not affect the propagation delay time of the reset signal.

Note that even though in the high voltage integrated circuit 10 the amount of heat generated by the high voltage transistor HVN2 during input of the reset signal is reduced, this does not contribute to reducing the amount of heat generated by the high voltage transistor HVN1 during input of the set signal. Therefore, from the perspective of reducing heat generation, the transistor Tr1 connected in parallel to the current negative feedback resistor Rsf1 is not strictly necessary. However, the respective parasitic capacitance components of set-side level shifters and reset-side level shifters are typically set to be equal in order to achieve the same operation during sets and resets. This is because any difference between the parasitic capacitance components of the set-side and reset-side creates different propagation conditions for set signals and reset signals, which can potentially result in malfunctions.

Furthermore, in a configuration in which the power devices QH and QL that form the half-bridge circuit drive a current-resonant circuit, as in a current-resonant switching power supply, for example, the voltage of the output terminal OUT during input of the set signal is not necessarily a low voltage. Therefore, when the high voltage integrated circuit 10 is used in such an application, the set-side level shifter and the reset-side level shifter need to have the same configuration.

Figure 3:
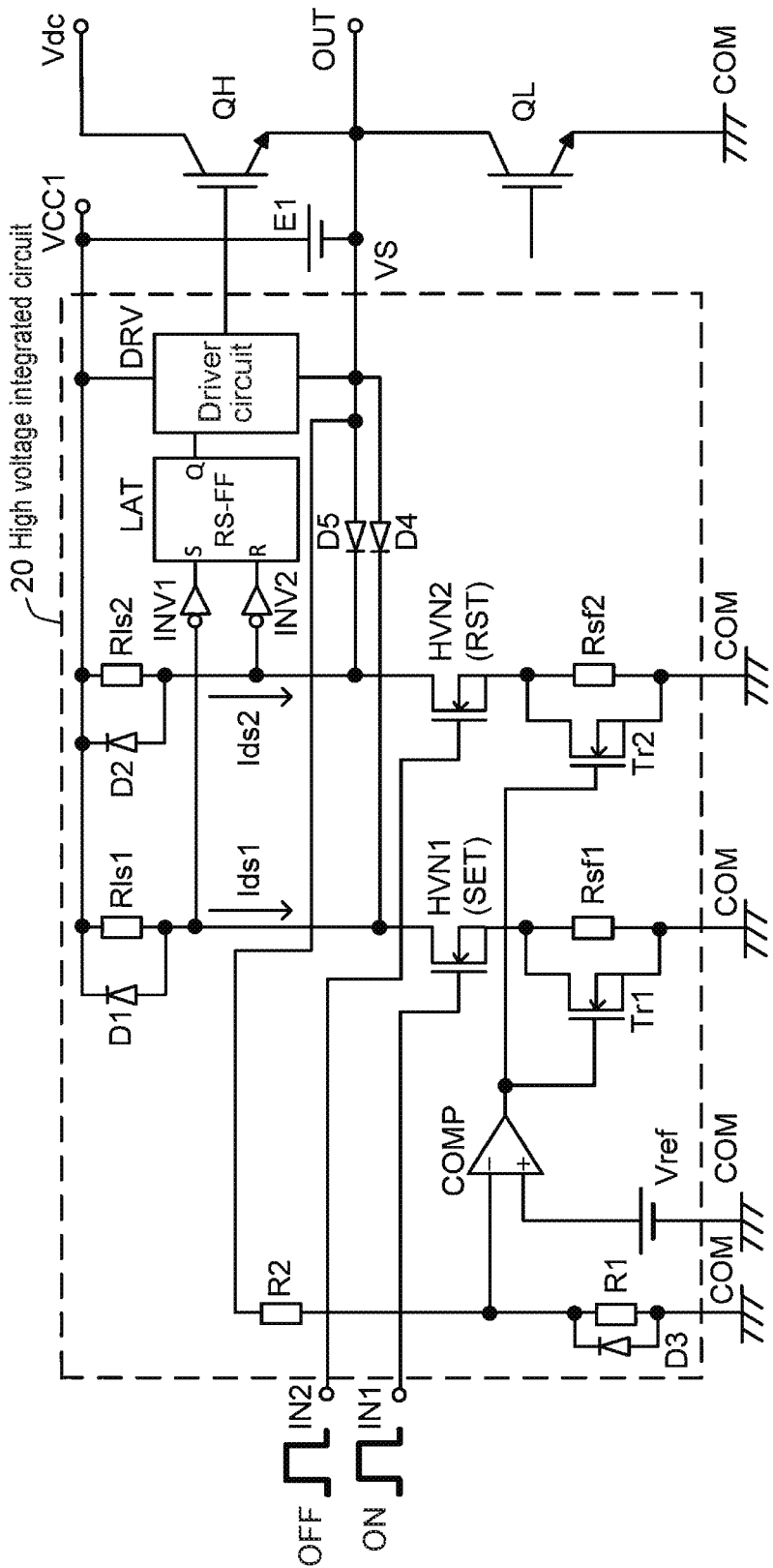
FIG. 3 is a circuit diagram illustrating an example configuration of a high voltage integrated circuit according to Embodiment 2 of the present invention.

FIG. 3 is a circuit diagram illustrating an example configuration of a high voltage integrated circuit according to Embodiment 2 of the present invention. Note that in FIG. 3, components that are the same as components illustrated in FIG. 1 are given the same reference characters.

In this high voltage integrated circuit 20 according to Embodiment 2, the high-side voltage detection circuit and the quantity detected by this high-side voltage detection circuit are different from in the high voltage integrated circuit 10 according to Embodiment 1. In other words, here the high-side voltage detection circuit includes voltage-dividing resistors R1 and R2 which are connected in series, a diode D3 connected in parallel to the voltage-dividing resistor R1, a comparator COMP, and a reference voltage source Vref.

The other terminal of the voltage-dividing resistor R2 is connected to the high-side reference voltage terminal VS, and therefore here the high-side voltage detection circuit detects changes in the voltage of the high-side reference voltage terminal VS. This is because the voltage of the high-side reference voltage terminal VS is always equal to the voltage VCC1 of the high-side power supply terminal VCC1 minus the voltage E1 of the floating power supply E1. The shared node between the voltage-dividing resistors R1 and R2 is connected to the inverting input terminal of the comparator COMP, while the non-inverting input terminal of the comparator COMP is connected to the positive terminal of the reference voltage source Vref and the negative terminal of the reference voltage source Vref is connected to the common voltage terminal COM. The output terminal of the comparator COMP is connected to the gate terminals of the transistors Tr1 and Tr2.

In this high voltage integrated circuit 20, the high-side voltage detection circuit divides the voltage of the high-side reference voltage terminal VS, and the divided voltage is compared to the reference voltage source Vref by the comparator COMP. When the voltage of the high-side reference voltage terminal VS is low, a voltage lower than that of the reference voltage source Vref is input to the comparator COMP, and therefore the comparator COMP outputs a high-level signal. As a result, the transistors Tr1 and Tr2 are turned ON, and the current negative feedback resistors Rsf1 and Rsf2 respectively take a substantially short-circuited state. At this time, when a signal that switches ON the power device QH is input to the input terminal IN1, the high voltage transistor HVN1 turns ON, and a drain current Ids1 flows through the high voltage transistor HVN1. Although this drain current Ids1 is large, the voltage of the drain terminal is low, and therefore the heat loss expended by the high voltage transistor HVN1 is small.

Meanwhile, when the voltage of the high-side reference voltage terminal VS increases and the voltage divided by the voltage-dividing resistors R1 and R2 exceeds that of the reference voltage source Vref, the comparator COMP outputs a low-level signal. As a result, the transistors Tr1 and Tr2 are turned OFF, and the combined resistances connected to the source terminals of the high voltage transistors HVN1 and HVN2 become equal to the current negative feedback resistors Rsf1 and Rsf2. At this time, when a signal that switches OFF the power device QH is input to the input terminal IN2, the high voltage transistor HVN2 turns ON, and a drain current Ids2 flows through the high voltage transistor HVN2. This drain current Ids2 is limited by the current negative feedback resistor Rsf2, and therefore the heat loss expended by the high voltage transistor HVN2 is small. At this time, due to the high voltage applied to the drain terminal of the high voltage transistor HVN2, the output capacitance Coss of the high voltage transistor HVN2 is small, and the time required to discharge electric charge stored in the output capacitance Coss is short, and therefore the propagation delay time of the reset signal does not increase. As a result, the high voltage integrated circuit 20 makes it possible to support high switching frequencies.

Although in Embodiment 2 above the high-side voltage detection circuit detects the voltage of the high-side reference voltage terminal VS, the high-side voltage detection circuit may detect the voltage of the high-side power supply terminal VCC1 as in Embodiment 1. Similarly, in Embodiment 1, the high-side voltage detection circuit may detect the voltage of the high-side reference voltage terminal VS as in Embodiment 2. Moreover, although the high voltage integrated circuits 10 and 20 were described as including only a circuit for controlling the high-side power device QH, a driver circuit for driving the low-side power device QL may be included as well.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A high voltage integrated circuit for controlling a high-side power transistor of a half-bridge circuit connected between a positive terminal and a grounded common terminal of a high voltage power supply, the half-bridge circuit being formed of said high-side power transistor and a lower-side power transistor connected in series with a node therebetween being an output terminal, a voltage at the output terminal being a high-side reference voltage, the high voltage integrated circuit comprising:
    a high-side driver circuit configured to be connected to the high-side power transistor to drive the high-side power transistor, the high-side driver circuit being powered by a high-side power supply voltage generated relative to the high-side reference voltage by a floating power supply;
    a level shifter circuit that converts an ON signal and an OFF signal that are input to the high voltage integrated circuit and that are set with reference to a common voltage of the common terminal to a level-shifted set signal and a level-shifted reset signal, respectively, that are set with reference to the high-side reference voltage;
    a high-side latch circuit that receives the level-shifted set signal and supplies a signal to the high-side driver circuit that causes the high-side driver circuit to turn on the high-side power transistor in response thereto and that receives the level-shifted reset signal and supplies a signal to the high-side driver circuit that causes the high-side driver circuit to turn off the high-side power transistor in response thereto; and
    a high-side voltage detection circuit that detects a voltage level of the high-side reference voltage or a voltage level of the high-side power supply voltage,
    wherein the level shifter circuit includes:
        a first high voltage transistor that causes the level-shifted set signal to output to the high-side latch circuit;
        a first resistor arranged between the first high voltage transistor and the common voltage;
        a second high voltage transistor that causes the level-shifted reset signal to output to the high-side latch circuit;
        a second resistor arranged between the second high voltage transistor and the common voltage; and
        a switching device that is connected in parallel to the second resistor and that is configured to be turned ON when the voltage level detected by the high-side voltage detection circuit is a low level and be turned OFF when the voltage level detected by the high-side voltage detection circuit is a high level.

2. The high voltage integrated circuit according to claim 1, wherein the level shifter circuit further includes another switching device that is connected in parallel to the first resistor and that is configured to be turned ON when the voltage level detected by the high-side voltage detection circuit is the low level and be turned OFF when the voltage level detected by the high-side voltage detection circuit is the high level.

3. The high voltage integrated circuit according to claim 2, wherein the high-side voltage detection circuit includes a first voltage-dividing resistor and a second voltage-dividing resistor that are connected in series and arranged between the common voltage and the high-side reference voltage or the high-side power supply voltage, and yet another switching device that outputs a signal which turns the switching device and said other switching device ON or OFF in accordance with a voltage of a node between the first voltage-dividing resistor and the second voltage-dividing resistor.

4. The high voltage integrated circuit according to claim 2, wherein the high-side voltage detection circuit includes a first voltage-dividing resistor and a second voltage-dividing resistor that are connected in series and arranged between the common voltage and the high-side reference voltage or the high-side power supply voltage, and a comparator that outputs a signal which turns the switching device and said other switching device ON or OFF in accordance with a voltage of a node between the first voltage-dividing resistor and the second voltage-dividing resistor.

5. The high voltage integrated circuit according to claim 3,
    wherein the first voltage-dividing resistor and the second voltage-dividing resistor are a resistive field plate formed surrounding a region of the level shifter circuit, the high-side latch circuit, and the high-side driver circuit, and
    wherein one end of the resistive field plate is connected to the high-side reference voltage or the high-side power supply voltage, another end of the resistive field plate is connected to the common voltage, and a voltage at an intermediate branching point therebetween is detected by the high-side voltage detection circuit.

6. The high voltage integrated circuit according to claim 4,
    wherein the first voltage-dividing resistor and the second voltage-dividing resistor are a resistive field plate formed surrounding a region of the level shifter circuit, the high-side latch circuit, and the high-side driver circuit, and
    wherein one end of the resistive field plate is connected to the high-side reference voltage or the high-side power supply voltage, another end of the resistive field plate is connected to the common voltage, and a voltage at an intermediate branching point therebetween is detected by the high-side voltage detection circuit.

* * * * *